(12) United States Patent
Kwon

(10) Patent No.: US 11,758,825 B2
(45) Date of Patent: Sep. 12, 2023

(54) METHOD OF MANUFACTURING MAGNETORESISTIVE RANDOM ACCESS MEMORY DEVICE

(71) Applicant: SAMSUNG ELECTRONICS CO., LTD., Suwon-si (KR)

(72) Inventor: Baeseong Kwon, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/567,211

(22) Filed: Jan. 3, 2022

(65) Prior Publication Data

US 2022/0123202 A1    Apr. 21, 2022

Related U.S. Application Data

(62) Division of application No. 16/819,506, filed on Mar. 16, 2020, now Pat. No. 11,223,009.

(30) Foreign Application Priority Data

Jul. 4, 2019  (KR) .................. 10-2019-0080642

(51) Int. Cl.
*H10N 50/80* (2023.01)
*H01L 23/522* (2006.01)
(Continued)

(52) U.S. Cl.
CPC ......... *H10N 50/80* (2023.02); *H01L 23/5226* (2013.01); *H10B 61/10* (2023.02); *H10B 61/20* (2023.02); *H10N 50/01* (2023.02)

(58) Field of Classification Search
CPC ......... H01L 43/02; H01L 43/12; H01L 43/08; H01L 43/10; H01L 43/00–14; H01L 27/222–228; H01L 27/11507; H01L 29/685; H01L 23/49506; H01L 23/5226; H01L 2924/1434; H01L 2924/1441; H01L 2924/1435; H01L 45/04; H01L 21/76807; H01L 21/76877; H01L 21/76819; H01L 21/8229; H01L 21/8239; H01L 43/14;
(Continued)

(56) References Cited

U.S. PATENT DOCUMENTS 6,713,798 B2   3/2004  Okita
6,987,045 B2   1/2006  Okita
(Continued)

FOREIGN PATENT DOCUMENTS

JP    2002-324852 A    11/2002
JP    2003-298022 A    10/2003
KR    10-2017-0001558 A    1/2017

*Primary Examiner* — Natalia A Gondarenko
(74) *Attorney, Agent, or Firm* — Lee IP Law, P.C.

(57) ABSTRACT

A magnetoresistive random access memory (MRAM) device and a method of manufacturing the same, the device including a substrate; a memory unit including a lower electrode, a magnetic tunnel junction (MTJ) structure, and an upper electrode sequentially stacked on the substrate; a passivation pattern on a sidewall of the memory unit; a via on the memory unit and contacting the upper electrode; and a wiring on the via and contacting the via, wherein a center portion of the upper electrode protrudes from a remaining portion of the upper electrode in a vertical direction substantially perpendicular to an upper surface of the substrate.

15 Claims, 8 Drawing Sheets

(51) Int. Cl.
*H10B 61/00* (2023.01)
*H10N 50/01* (2023.01)

(58) Field of Classification Search
CPC ... H01L 27/228; H01L 27/224; H01L 27/226; G11C 19/02; G11C 19/08; G11C 19/0825; G11C 19/14; G11C 19/28; G11C 19/34; G11C 19/282; G11C 14/0036; G11C 14/008; G11C 11/15; G11C 11/161; H10N 50/01; H10N 50/10; H10N 50/80; H10N 50/85; H10B 61/00; H10B 61/10; H10B 61/20
USPC .... 438/3, 689; 257/421, 295, E21.001, E21, 257/665, E43.001, E43.006
See application file for complete search history.

(56) References Cited

U.S. PATENT DOCUMENTS

| | | | |
|---|---|---|---|
| 8,339,841 B2 | 12/2012 | Iwayama | |
| 8,748,197 B2 | 6/2014 | Yu-Jen et al. | |
| 8,921,959 B2 | 12/2014 | Sung et al. | |
| 8,975,088 B2 | 3/2015 | Satoh et al. | |
| 9,564,577 B1 | 2/2017 | Hsu et al. | |
| 9,818,935 B2 | 11/2017 | Chuang et al. | |
| 9,978,934 B2 | 5/2018 | Paranjpe et al. | |
| 2008/0073750 A1 | 3/2008 | Kanaya | |
| 2012/0282711 A1* | 11/2012 | Abedifard | H01L 43/12 438/3 |
| 2013/0052752 A1* | 2/2013 | Satoh | H01L 29/00 257/E21.665 |
| 2014/0042567 A1* | 2/2014 | Jung | H01L 43/12 257/E43.001 |
| 2014/0264516 A1* | 9/2014 | Seo | H01L 21/31144 257/295 |
| 2015/0263267 A1 | 9/2015 | Kanaya | |
| 2018/0097176 A1 | 4/2018 | Chuang et al. | |
| 2020/0098978 A1* | 3/2020 | Liao | G11C 11/161 |
| 2020/0135805 A1 | 4/2020 | Hsu | |
| 2020/0227625 A1 | 7/2020 | Wang et al. | |

* cited by examiner

METHOD OF MANUFACTURING MAGNETORESISTIVE RANDOM ACCESS MEMORY DEVICE

CROSS-REFERENCE TO RELATED APPLICATION

This is a division of U.S. patent application Ser. No. 16/819,506, filed on Mar. 16, 2020, which is incorporated by reference herein in its entirety.

Korean Patent Application No. 10-2019-0080642, filed on Jul. 4, 2019, in the Korean Intellectual Property Office, and entitled: "Magnetoresistive Random Access Device and Method of Manufacturing the Same," is incorporated by reference herein in its entirety.

BACKGROUND

1. Field

Embodiments relate to a magnetoresistive random access memory (MRAM) device and a method of manufacturing the same.

2. Description of the Related Art

In a method of manufacturing an MRAM device, after forming an upper electrode on a lower electrode layer and a magnetic tunnel junction (MTJ) structure layer sequentially stacked on a substrate, an ion-beam etching (IBE) process using the upper electrode as an etching mask may be performed on the lower electrode layer and the MTJ structure layer in a diagonal direction (e.g., not perpendicular to an upper surface of the substrate) to form a lower electrode and an MTJ structure.

SUMMARY

The embodiments may be realized by providing a magnetoresistive random access memory (MRAM) device including a substrate; a memory unit including a lower electrode, a magnetic tunnel junction (MTJ) structure, and an upper electrode sequentially stacked on the substrate; a passivation pattern on a sidewall of the memory unit; a via on the memory unit and contacting the upper electrode; and a wiring on the via and contacting the via, wherein a center portion of the upper electrode protrudes from a remaining portion of the upper electrode in a vertical direction substantially perpendicular to an upper surface of the substrate.

The embodiments may be realized by providing a magnetoresistive random access memory (MRAM) device including a substrate; a memory unit including a lower electrode, a magnetic tunnel junction (MTJ) structure, and an upper electrode sequentially stacked on the substrate; a passivation pattern on a sidewall of the memory unit; a via on the memory unit and contacting each of the upper electrode and the passivation pattern; and a wiring on the via and electrically connected to the via, wherein the upper electrode includes a first portion, a second portion, and a third portion that are sequentially stacked and integrally formed, and a decrease in width of the second portion of the upper electrode along a vertical direction substantially perpendicular to an upper surface of the substrate is greater than a decrease in width of the first portion of the upper electrode and the third portion of the upper electrode along the vertical direction The embodiments may be realized by providing a magnetoresistive random access memory (MRAM) device including a substrate; a memory unit including a lower electrode, a magnetic tunnel junction (MTJ) structure, and an upper electrode sequentially stacked on the substrate; a passivation pattern on a sidewall of the memory unit; a via on the memory unit and contacting the upper electrode; and a wiring on the via and electrically connected to the via, wherein the upper electrode includes a first portion having a sidewall with a constant slope, a second portion having a sidewall with a varying slope, and a third portion protruding from the second portion in a vertical direction substantially perpendicular to an upper surface of the substrate, and a lower surface of the via has a concave shape in the vertical direction at a portion in contact with the third portion of the upper electrode.

The embodiments may be realized by providing a method of manufacturing a magnetoresistive random access memory (MRAM) device, the method including sequentially forming a lower electrode layer, a magnetic tunnel junction (MTJ) structure layer, and an upper electrode layer on a substrate; forming a mask on the upper electrode layer; performing a first etching process using the mask on the upper electrode layer to form a preliminary upper electrode; performing a second etching process on the mask remaining on the preliminary upper electrode to reduce a width of the mask; and forming an upper electrode by performing a third etching process using the remaining mask having the reduced width to partially remove an upper portion of the preliminary upper electrode.

The embodiments may be realized by providing a method of manufacturing a magnetoresistive random access memory (MRAM) device, the method including sequentially forming a lower electrode layer, a magnetic tunnel junction (MTJ) structure layer, and an upper electrode layer on a substrate; forming a sacrificial pattern on the upper electrode layer such that the sacrificial pattern includes an opening; forming a mask to fill the opening and then removing the sacrificial pattern; etching the upper electrode layer using the mask to form an upper electrode; etching the mask that remains on the upper electrode to reduce a width of the mask; partially removing an upper portion of the upper electrode by using the mask that has the reduced width; etching the lower electrode layer and the MTJ structure layer by using the upper electrode that the upper portion is partially removed as an etching mask to form a lower electrode and an MTJ structure; forming a via to contact an upper surface of the upper electrode; and forming a wiring to contact the via.

BRIEF DESCRIPTION OF THE DRAWINGS

Features will be apparent to those of skill in the art by describing in detail exemplary embodiments with reference to the attached drawings in which.

DETAILED DESCRIPTION

FIGS. 1 to 10 illustrate cross-sectional views of stages in a method of manufacturing an MRAM device in accordance with example embodiments.

Figure 1:
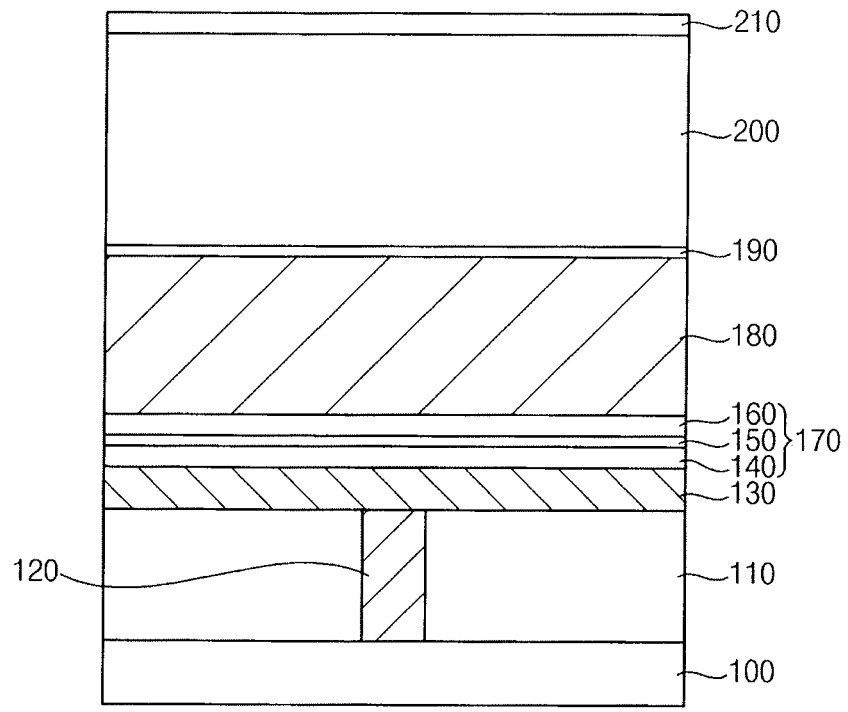
FIGS. 1 to 10 illustrate cross-sectional views of stages in a method of manufacturing an MRAM device in accordance with example embodiments.

Referring to FIG. 1, a first insulating interlayer 110 may be formed on a substrate 100, and a contact plug 120 may be formed to extend through the first insulating interlayer 110 and contact an upper surface of the substrate 100.

The substrate 100 may include a semiconductor material, e.g., silicon, germanium, silicon-germanium, or III-V semiconductor compounds, e.g., GaP, GaAs, GaSb, or the like. In an example embodiment, the substrate 100 may be a silicon-on-insulator (SOI) substrate or a germanium-on-insulator (GOI) substrate. As used herein, the term "or" is not an exclusive term, e.g., "A or B" would include A, B, or A and B.

In an implementation, various structures e.g., word lines, transistors, diodes, source/drain layers, contacts plugs, vias, wirings, or the like, may be formed on the substrate 100.

The first insulating interlayer 110 may be formed on the substrate 100 to cover the various structures. The first insulating interlayer 110 may include an oxide, e.g., silicon oxide.

The contact plug 120 may be formed by forming a first opening extending through the first insulating interlayer 110 and exposing the upper surface of the substrate 100, forming a conductive layer on the substrate 100 and the first insulating interlayer 110 to fill the first opening, and planarizing an upper portion of the conductive layer until an upper surface of the first insulating interlayer 110 may be exposed. The conductive layer may include a metal (e.g., tungsten, titanium, tantalum, or the like), a metal nitride (e.g., tungsten nitride, titanium nitride, or tantalum nitride), or polysilicon doped with impurities.

Thereafter, a lower electrode layer 130, a magnetic tunnel junction (MTJ) structure layer 170, an upper electrode layer 180, an etch stop layer 190, a sacrificial layer 200, and a first mask layer 210 may be sequentially formed on the first insulating interlayer and the contact plug 120. In an implementation, the MTJ structure layer 170 may include a fixed layer 140, a tunnel barrier layer 150, and a free layer 160.

The lower and upper electrode layers 130 and 180 may include a metal or a metal nitride.

In an implementation, a barrier layer may be further formed on the lower electrode layer 130 to help reduce or prevent abnormal growth of the metal included in the fixed layer 140. The barrier layer may include amorphous metal or metal nitride, e.g., tantalum, tantalum nitride, titanium, titanium nitride, or the like.

In an implementation, the fixed layer 140 may include a lower ferromagnetic layer, an anti-ferromagnetic coupling spacer layer, and an upper ferromagnetic layer.

The fixed layer 140 may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, or Cr. The lower and upper ferromagnetic layers may include, e.g., Fe, Ni, or Co. The anti-ferromagnetic coupling spacer layer may include, e.g., Ru, Ir, or Rh.

The tunnel barrier layer 150 may include, e.g., aluminum oxide or magnesium oxide, and the free layer 160 may include, e.g., Fe, Ni, or Co.

The etch stop layer 190 may include a nitride, e.g., silicon nitride, and the sacrificial layer 200 may include, e.g., spin on hardmask (SOH), and the first mask layer 210 may include an oxide, e.g., silicon oxide.

Figure 2:
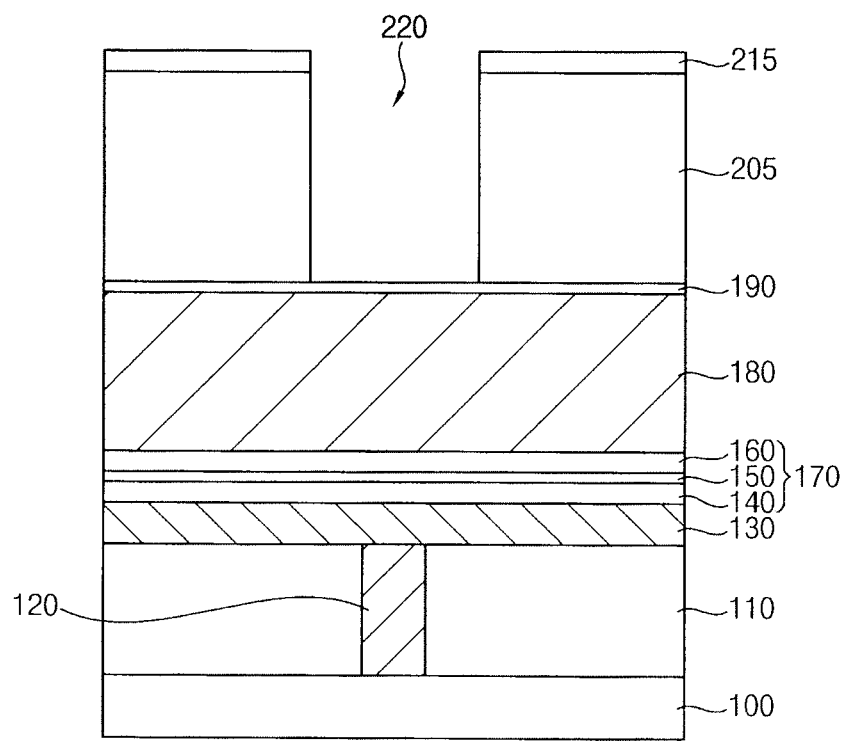

Referring to FIG. 2, after forming a first mask 215 by performing a photolithography process using a photoresist pattern on the first mask layer 210, a first etching process using the first mask 215 as an etching mask may be performed to etch the sacrificial layer thereunder, and a sacrificial pattern 205 (including a second opening 220 partially exposing an upper surface of the etch stop layer 190) may be formed.

In an implementation, the upper surface of the etch stop layer 190 exposed by the second opening 220 may also be partially etched, but the upper electrode layer 180 may not be etched, because it is protected by the etch stop layer 190.

The first mask 215 remaining on the sacrificial pattern 205 after the first etching process may be removed.

Figure 3:
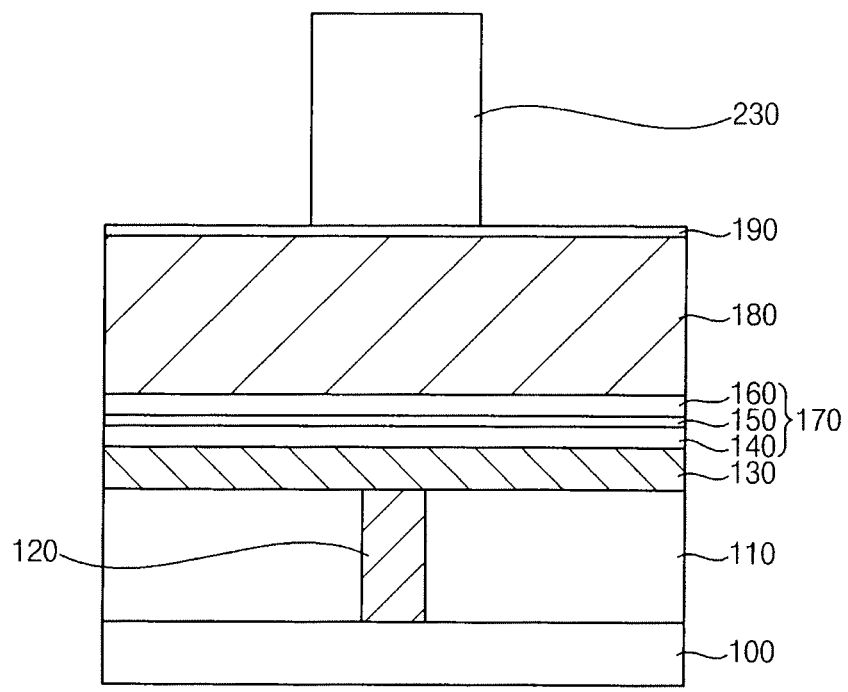

Referring to FIG. 3, after forming a second mask layer on the exposed upper surface of the etch stop layer 190 and the sacrificial layer 200 to sufficiently fill the second opening 220, the second mask layer may be planarized until an upper surface of the sacrificial pattern 205 is exposed to form a second mask 230, and the sacrificial pattern 205 may be removed after the planarization process. For example, a remaining portion of the upper surface of the etch stop layer 190 (e.g., except for a portion on which the second mask 230 is formed on or covers) may be exposed.

In an implementation, a plurality of second masks 230 may be formed along a horizontal direction substantially parallel to the upper surface of the substrate 100, and each of the second masks 230 may have a pillar shape extending in a vertical direction substantially perpendicular to the upper surface of the substrate 100.

In an implementation, the second mask 230 may have a flat upper surface. In an implementation, the second mask 230 may also have an upper surface that a center portion is concave or convex.

In an implementation, the planarization process may be performed by a chemical mechanical polishing process or an etch back process.

Figure 4:
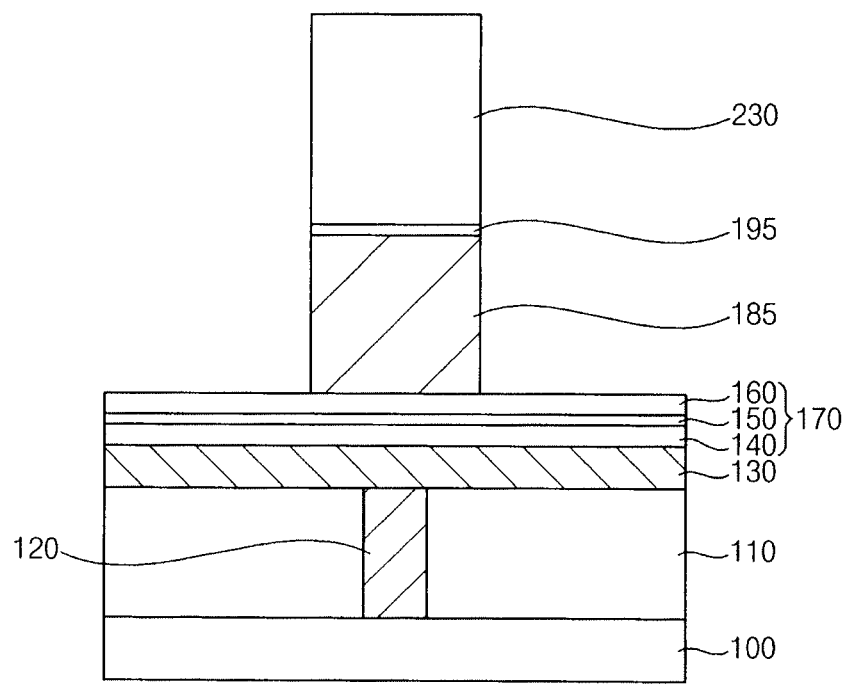

Referring to FIG. 4, the etch stop layer 190 and the upper electrode layer 180 may be sequentially patterned by a second etching process using the second mask 230 as an etching mask, and a preliminary upper electrode 185 and an etch stop pattern 195 sequentially stacked may be formed on the MTJ structure layer 170.

The second etching process may include a dry etching process, and may be performed until an upper surface of the MTJ structure layer 170 is exposed.

Figure 5:
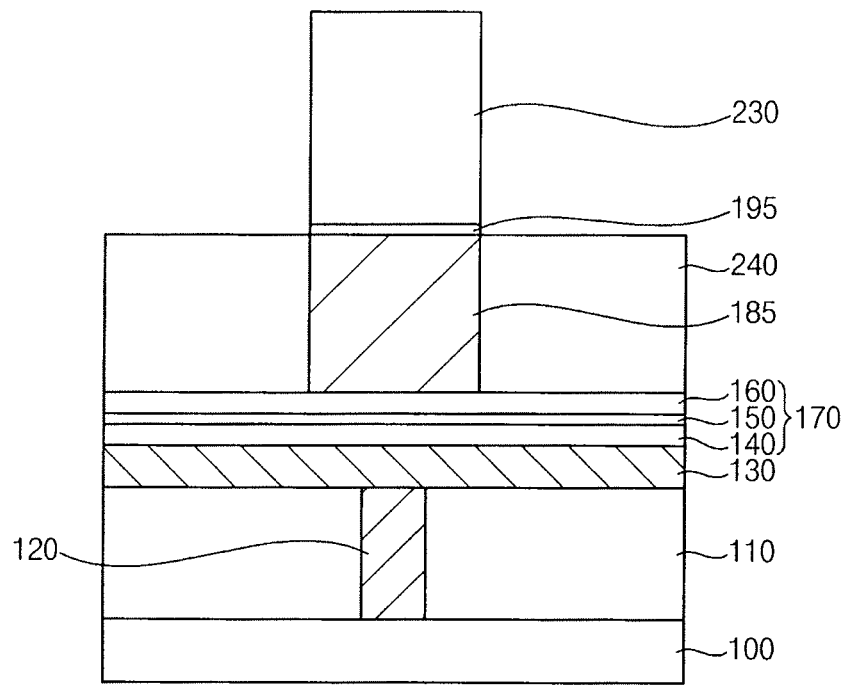

Referring to FIG. 5, after forming a second insulating interlayer 240 to cover a sidewall of the preliminary upper electrode 185, a sidewall of the etch stop pattern 195, and a sidewall and an upper surface of the second mask 230, an upper portion of the second insulating interlayer 240 may be removed until the sidewall of the etch stop pattern 195 is exposed. For example, the sidewall and the upper surface of the second mask 230 may be exposed. The upper portion of the second insulating interlayer 240 may be removed by, e.g., CMP process and/or an etch back process.

In an implementation, as illustrated in FIG. 5, all portions of the sidewalls of the etch stop pattern 195 may be exposed when the upper portion of the second insulating interlayer 240 is removed. In an implementation, only an upper portion of the sidewall of the etch stop pattern 195 may be exposed, and a lower portion of the sidewall of the etch stop pattern 195 may not be exposed.

Figure 6:
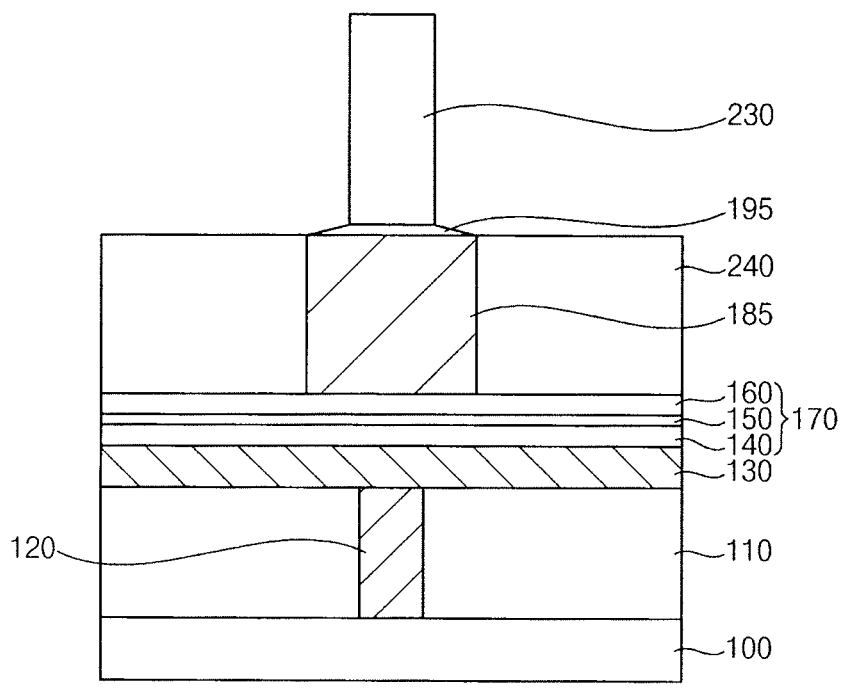

Referring to FIG. 6, a third etching process may be performed to partially remove the exposed sidewall of the second mask 230, and a width of the second mask 230 may be reduced.

The third etching process may include a wet etching process.

The etch stop pattern 195 may also be partially removed, and the preliminary upper electrode 185 may still be protected by the (e.g., remaining portions of the) etch stop pattern 195.

In an implementation, the reduced width of the second mask 230 may be smaller than a width of the preliminary upper electrode 185 (e.g., as measured in the horizontal direction parallel to the top surface of the substrate 100). In an implementation, the etch stop pattern 195 may have a width that increases from a top side or upper surface thereof (e.g., distal to the substrate 100) toward a bottom side or lower surface thereof (e.g., proximate to the substrate 100). In an implementation, the upper surface of the etch stop pattern 195 may have substantially the same width as a lower surface of the second mask 230 (e.g., having the reduced width), and the lower surface of the etch stop pattern 195 may have substantially the same width as an upper surface of the preliminary upper electrode 185. For example, the etch stop pattern 195 may have a trapezoidal cross-sectional shape.

In an implementation, the second mask 230 having the reduced width may have a sidewall that is substantially vertical or perpendicular to the upper surface of the substrate 100, and may have a flat upper surface. In an implementation, the second mask 230 having the reduced width may have a sidewall that is not vertical to the upper surface of the substrate 100, or may have a concave or convex upper surface.

Figure 7:
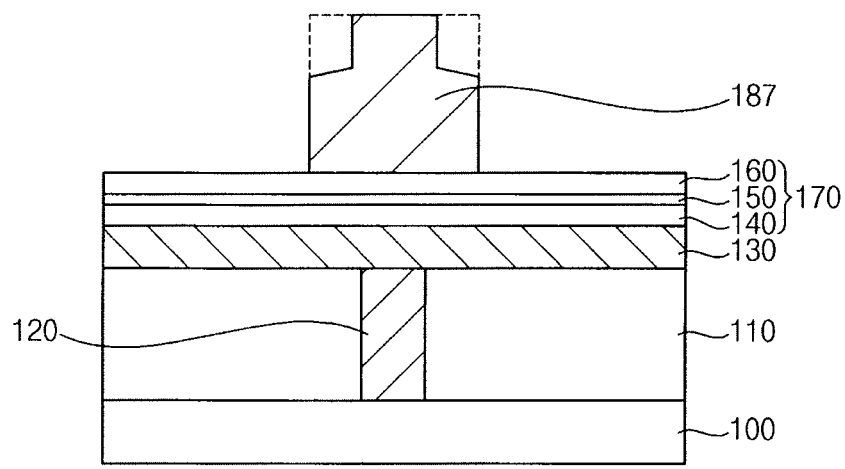

Referring to FIG. 7, a fourth etching process using the second mask 230 (having the reduced width) as an etching mask may be performed to partially remove the etch stop pattern 195 and an upper portion of the preliminary upper electrode 185, and an upper electrode 187 may be formed.

The fourth etching process may be performed to partially remove an edge region of the upper portion of the preliminary upper electrode 185, without removing a lower portion of the preliminary upper electrode 185. For example, the upper electrode 187 formed by partially removing the preliminary upper electrode 185 may have a shape in which a center portion thereof protrudes from a remaining portion in the vertical direction.

In an implementation, the center portion of the upper electrode 187 having the protruding shape may have a sidewall that is substantially vertical to the upper surface of the substrate 100, and may have a flat upper surface. In an implementation, the center portion of the upper electrode 187 having the protruding shape may have a sidewall that is not vertical, but rather inclined with respect to the upper surface of the substrate 100, and may also have a concave or convex upper surface.

The fourth etching process may include a dry etching process.

Figure 8:
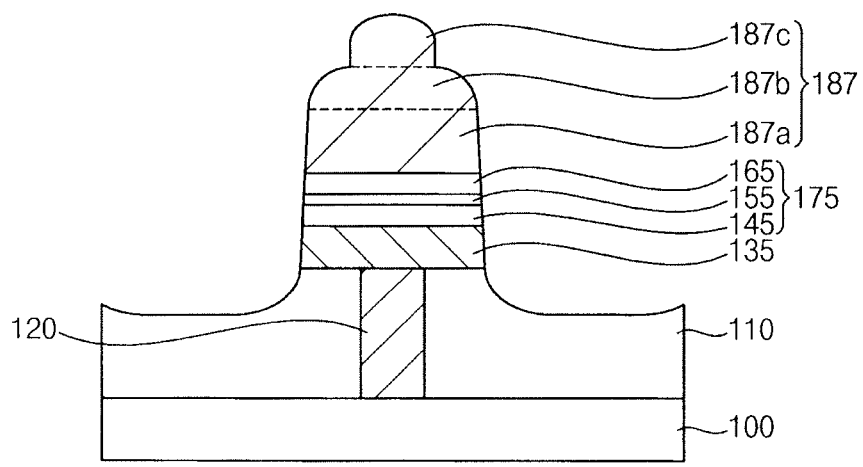

Referring to FIG. 8, the lower electrode layer 130, the fixed layer 140, the tunnel barrier layer 150, and the free layer 160 may be sequentially patterned by a fifth etching process using the upper electrode 187 as an etching mask to form a memory unit including a lower electrode 135, a fixed layer pattern 145, a tunnel barrier pattern 155, a free layer pattern 165, and an upper electrode 187 sequentially stacked on the contact plug 120. The fixed layer pattern 145, the tunnel barrier pattern 155, and the free layer pattern 165 may form an MTJ structure 175.

The fifth etching process may include a dry etching process, e.g., ion-beam etching (IBE) process. The IBE process may be performed a plurality of times in a diagonal direction (e.g., not perpendicular to the upper surface of the substrate 100), and may be performed using an etching gas that includes a fluorine-containing gas and an ammonia ($NH_3$) gas, and an oxygen gas for suppressing consumption of the upper electrode 187 as a reaction gas.

In an implementation, the dry etching process may be performed by, e.g., three times of the IBE processes, and each of the IBE processes may be performed at an angle of 65°, 35°, and 35° with respect to the upper surface of the substrate 100.

As the dry etching process is performed, an upper portion of the first insulating interlayer 110 may also be partially removed, and the first insulating interlayer 110 may have a concave upper surface.

The upper electrode 187 may include a lower portion 187a, a central or middle portion 187b, and a protruding portion 187c integrally formed along the vertical direction and sequentially stacked. For example, the upper electrode 187 may have a shape in which a center portion protrudes in the vertical direction from or with respect to a remaining portion as a whole. The lower portion 187a, the middle portion 187b, and the protruding portion 187c of the upper electrode 187 may be referred to as first to third portions 187a, 187b, and 187c, respectively, of the upper electrode 187.

In an implementation, a sidewall of the lower portion 187a of the upper electrode 187 may have a constant slope (e.g., may be flat), a sidewall of the middle portion 187b of the upper electrode 187 may have a slope that gradually decreases toward the top (e.g., away from the substrate 100, such that the sidewall of the middle portion 187b may be curved), and a sidewall of the protruding portion 187c of the upper electrode 187 may have a slope greater than that of the middle portion 187b adjacent thereto. In an implementation, the sidewall of the protruding portion 187c of the upper electrode 187 may have a constant slope (e.g., may be flat), and at least a portion, e.g., a lower portion of the sidewall thereof (e.g., proximate to the substrate 100) may be substantially vertical to the upper surface of the substrate 100.

In an implementation, the lower portion 187a of the upper electrode 187 may have a width that gradually decreases toward the top (e.g., in a direction away from the substrate 100) such that the lower portion 187a may have a slightly tapered shape, the middle portion 187b of the upper electrode 187 may have a width that sharply decreases in the direction away from the substrate 100 such that the middle portion 187b may have a rounded shape, and the protruding portion 187c of the upper electrode 187 may have a width that decreases in the direction away from the substrate 100. In an implementation, the protruding portion 187c of the upper electrode 187 may have a constant width in the direction away from the substrate 100.

In an implementation, at least a center region of an upper surface of the protruding portion 187c of the upper electrode 187 may be flat, and an edge region of the upper surface thereof may be rounded.

The lower portion 187a, the middle portion 187b, and the protruding portion 187c of the upper electrode 187 may have different thicknesses in the vertical direction. For example, the lower portion 187a may have the greatest thickness, the middle portion 187b may have the smallest thickness, and the protruding portion 187c may have a thickness smaller than the lower portion 187a and greater than the middle portion 187b.

As described above, even if the upper electrode 187 is formed to have a great thickness (e.g., in the vertical direction), an upper portion of the upper electrode 187, e.g., the protruding portion 187c of the upper electrode 187, may have the reduced width, so that ions implanted through the IBE process may not be blocked by the upper electrode 187. For example, the lower electrode layer 130 and the MTJ structure layer 170 may be effectively patterned without being affected by neighboring upper electrodes 187.

The lower portion 187*a*, the middle portion 187*b*, and the protruding portion 187*c* of the upper electrode 187 may have various thicknesses, and these will be described below.

In an implementation, as illustrated in FIG. 8, a lower surface of the memory unit may have a greater area than an upper surface of the contact plug 120. In an implementation, the lower surface of the memory unit may have an area substantially the same as the upper surface of the contact plug 120. In an implementation, a conductive pad may be further formed between the contact plug 120 and the memory unit.

Figure 9:
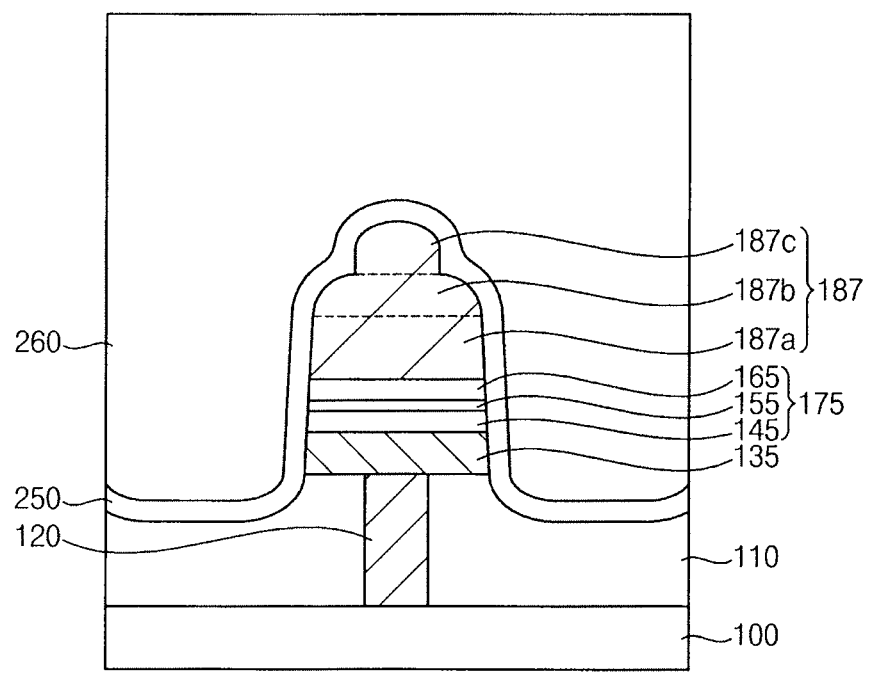

Referring to FIG. 9, a passivation layer 250 may be formed on the first insulating interlayer 110 to cover the memory unit, and a third insulating interlayer 260 may be formed on the passivation layer 250.

Each of the passivation layer 250 and the third insulating interlayer 260 may be formed by, e.g., an atomic layer deposition (ALD) process, a physical vapor deposition (PVD) process, a chemical vapor deposition (CVD) process, a high density plasma chemical vapor deposition (HDP-CVD) process, or the like.

The passivation layer 250 may include a nitride, e.g., silicon nitride, and the third insulating interlayer 260 may include an oxide, e.g., silicon oxide.

Figure 10:
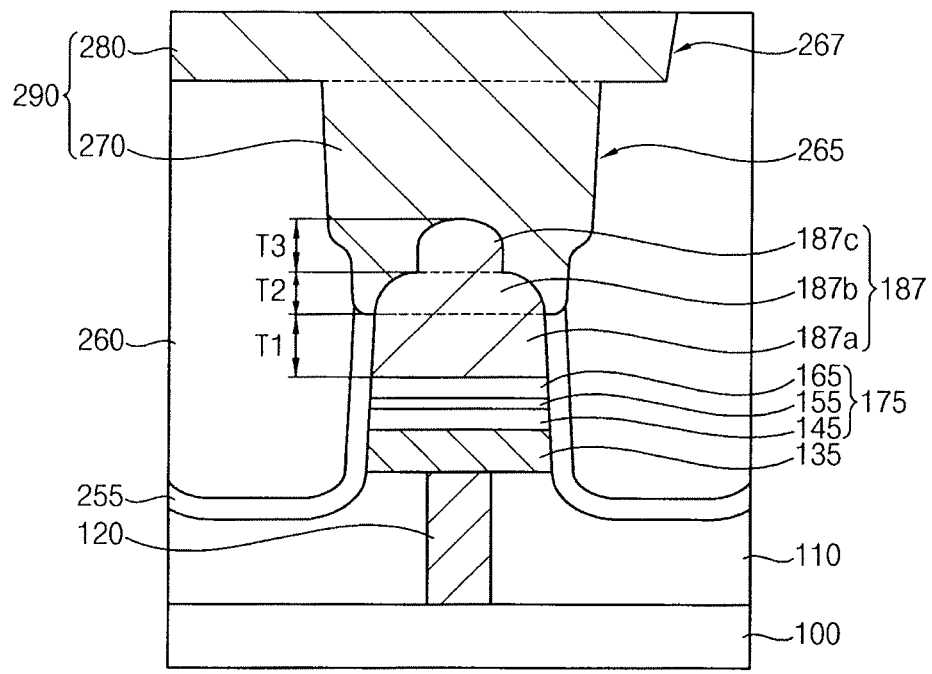

Referring to FIG. 10, after forming a trench 267 extending through an upper portion of the third insulating interlayer 260 and a via hole 265 being connected thereto and exposing a portion of the passivation layer 250, a portion of the exposed passivation layer 250 may be removed to expose the upper electrode 187, and a via 270 and a wiring 280 may be formed to fill the via hole 265 and the trench 267, respectively. The via 270 and the wiring 280 may be sequentially stacked and together may form a wiring structure 290.

In an implementation, the trench 267 may be formed by removing the upper portion of the third insulating interlayer 260 by performing a dry etching process using a first etching mask, the via hole 265 being connected to the trench 267 and exposing the portion of the passivation layer 250 on the memory unit may be formed by performing a dry etching process using a second etching mask, and the exposed portion of the passivation layer 250 may be removed by performing a wet etching process. In an implementation, the exposed portion of the passivation layer 250 may be also removed by performing a dry etching process. For example, the passivation layer 250 may be converted into a passivation pattern 255.

A barrier layer may be formed on an upper surface of the exposed upper electrode 187, an upper surface of the passivation pattern 255, a sidewall of the via hole 265, a lower surface and a sidewall of the trench 267 and an upper surface of the third insulating interlayer 260, a metal layer may be formed on the barrier layer to fill the via hole 265 and the trench 267, and the metal layer and the barrier layer may be planarized until the upper surface of the third insulating interlayer 260 may be exposed to form the via 270 and the wiring 280 each including a barrier pattern and a metal pattern.

In an implementation, each of the planarization processes may be performed by a CMP process and/or an etch back process.

The barrier layer may include a metal nitride, e.g., tantalum nitride, titanium nitride, or the like, or a metal, e.g., tantalum, titanium, or the like, and the metal layer may include a metal, e.g., tungsten, copper, aluminum, or the like.

The via 270 may contact at least the middle portion 187*b* and the protruding portion 187*c* of the upper electrode 187, and may further contact an uppermost surface of the passivation pattern 255 adjacent to the lower portion 187*a* of the upper electrode 187. In an implementation, a lower surface of the via 270 may have a concave-convex shape in which a center region is concave in the vertical direction, and an edge region is concave in the vertical direction. In an implementation, a lowermost surface of the via 270 may be at a height higher than or equal to an upper end of the lower portion 187*a* of the upper electrode 187.

In an implementation, a sidewall of the via 270 may have a varying slope, e.g., may not be vertical to the upper surface of the substrate 100, and a width of the via 270 may decrease closer to the uppermost surface of the passivation pattern 255 (e.g., toward the substrate 100).

The fabrication of the MRAM device may be completed by performing the processes described above. In an implementation, the MRAM device may include a plurality of memory units, and the wiring structure 290 may be formed to be commonly connected to the plurality of memory units. In this case, the wiring structure 290 may serve as a bit line of the MRAM device.

As described above, even if the upper electrode 187 is formed to have a great thickness (e.g., in the vertical direction), the lower electrode 135 and the MTJ structure 175 may be effectively formed, and a sufficient distance may be secured between the memory unit and the wiring structure 290 in the vertical direction. For example, the electrical short and the magnetic field immunity of the memory unit and the wiring structure 290 may be minimized, and the electrical characteristics of the MRAM device may be improved.

FIGS. 11 to 15 illustrate cross-sectional views of MRAM devices in accordance with example embodiments. These MRAM devices are substantially the same as or similar to the MRAM device described in FIG. 10, except for the shape of the upper electrode 187 and the shape of the via 270 thereon. Thus, like reference numerals refer to like elements, and repeated detailed descriptions thereof may be omitted herein.

Figure 11:
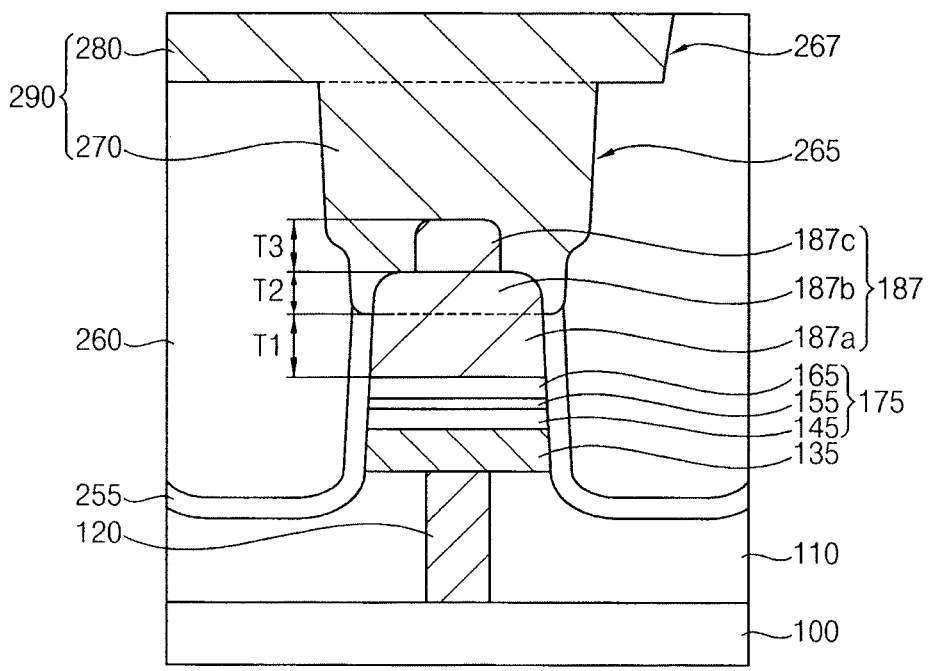
FIGS. 11 to 15 illustrate cross-sectional views of MRAM devices in accordance with example embodiments.

Referring to FIG. 11, the protruding portion 187*c* of the upper electrode 187 may have a sidewall substantially vertical to the upper surface of the substrate 100, and may have a flat upper surface as a whole. The middle portion 187*b* of the upper electrode 187 may also have a sidewall substantially vertical to the upper surface of the substrate 100, and may have a flat upper surface as a whole.

In an implementation, the upper electrode 187 may have a width constantly decreasing upward from the lower portion 187*a* and the middle portion 187*b*. In an implementation, the width of the upper electrode 187 may rapidly decrease as closer to a lower surface of the protruding portion 187*c* (e.g., a width of the protruding portion 187*c* may decrease in a discontinuous, stepwise manner, relative to widths of the lower portion 187*a* and the middle portion 187*b*). For example, a decrease in width of the middle portion 187*b* of the upper electrode 187 along the vertical direction may be greater than a decrease in width of the lower portion 187*a* and the protruding portion 187*c* of the upper electrode 187 along the vertical direction. The upper electrode 187 may have a relatively constant width from the protruding portion 187*c* to the top along the vertical direction.

Figure 12:
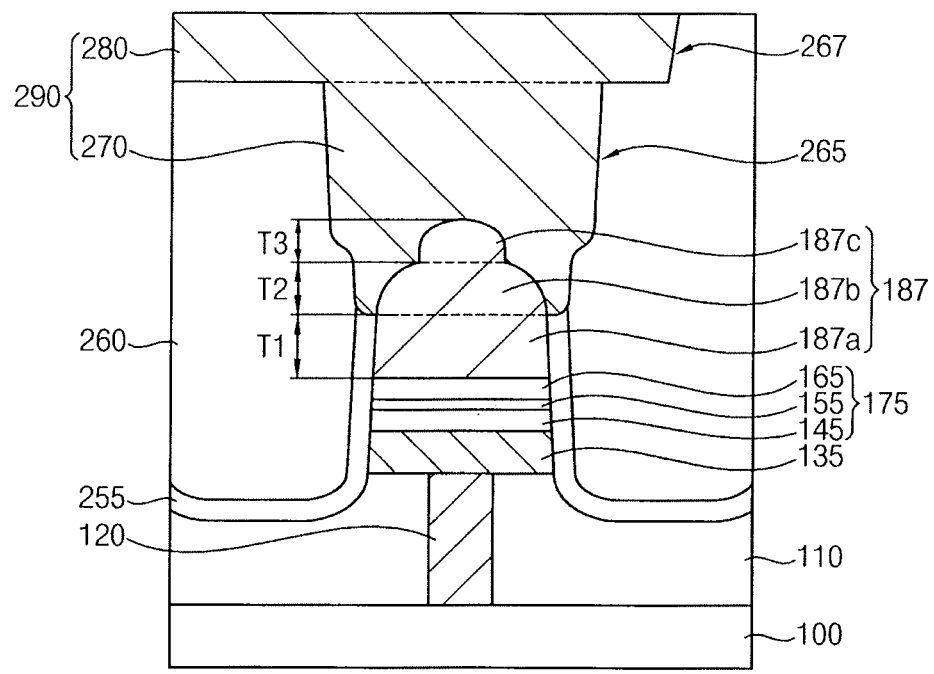

Referring to FIG. 12, the upper electrode 187 may have a greatest thickness at the lower portion 187a, and may have a smallest thickness at the protruding portion 187c. The middle portion 187b of the upper electrode 187 may have a thickness smaller than the lower portion 187a, and greater than the protruding portion 187c.

In an implementation, the via 270 may contact each of the protruding portion 187c and the middle portion 187b of the upper electrode 187, and may not contact the lower portion 187a of the upper electrode 187.

Figure 13:
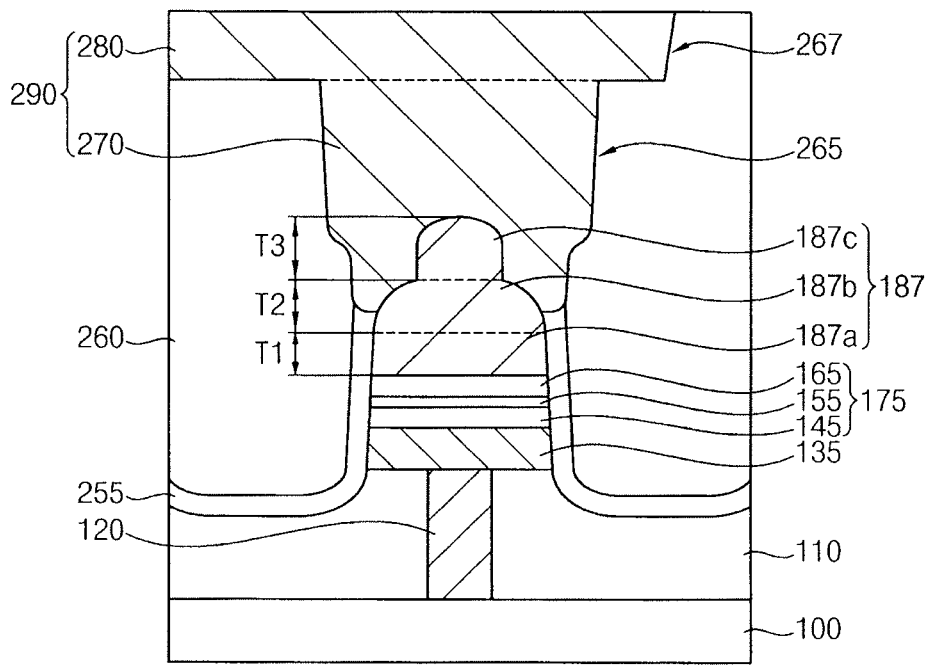

Referring to FIG. 13, the upper electrode 187 may have a greatest thickness at the protruding portion 187c, and may have a smallest thickness at the lower portion 187a. The middle portion 187b of the upper electrode 187 may have a thickness smaller than the protruding portion 187c, and greater than the lower portion 187a.

In an implementation, the via 270 may contact each of the protruding portion 187c and the middle portion 187b of the upper electrode 187, and may not contact the lower portion 187a of the upper electrode 187, and may also not contact a portion of the sidewall of the middle portion 187b.

Figure 14:
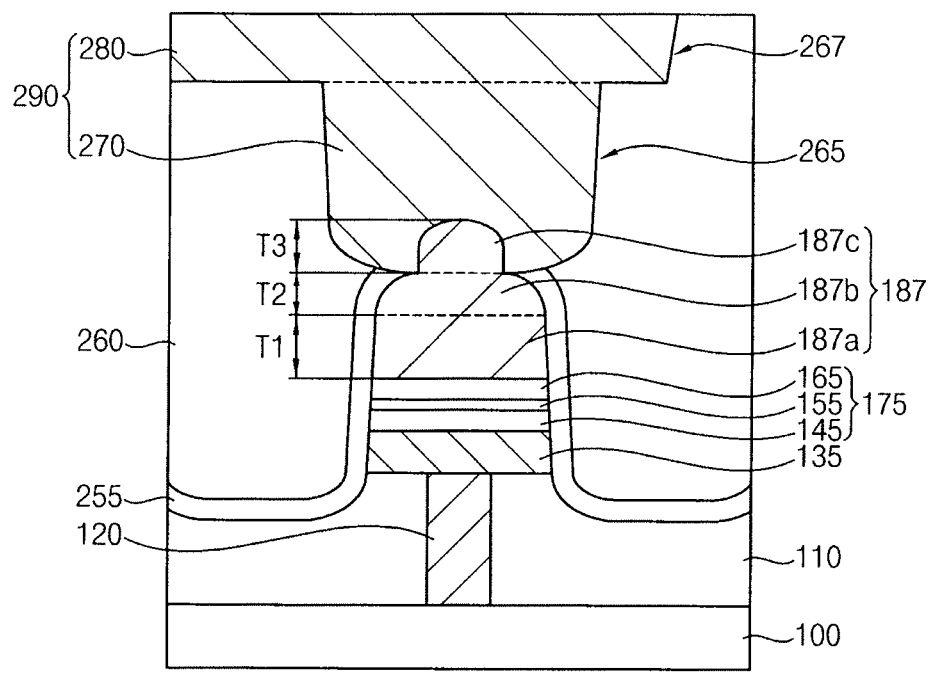

Referring to FIG. 14, the via 270 may contact only the protruding portion 187c of the upper electrode 187, and may not contact the middle portion 187b or the lower portion 187a of the upper electrode 187.

Figure 15:
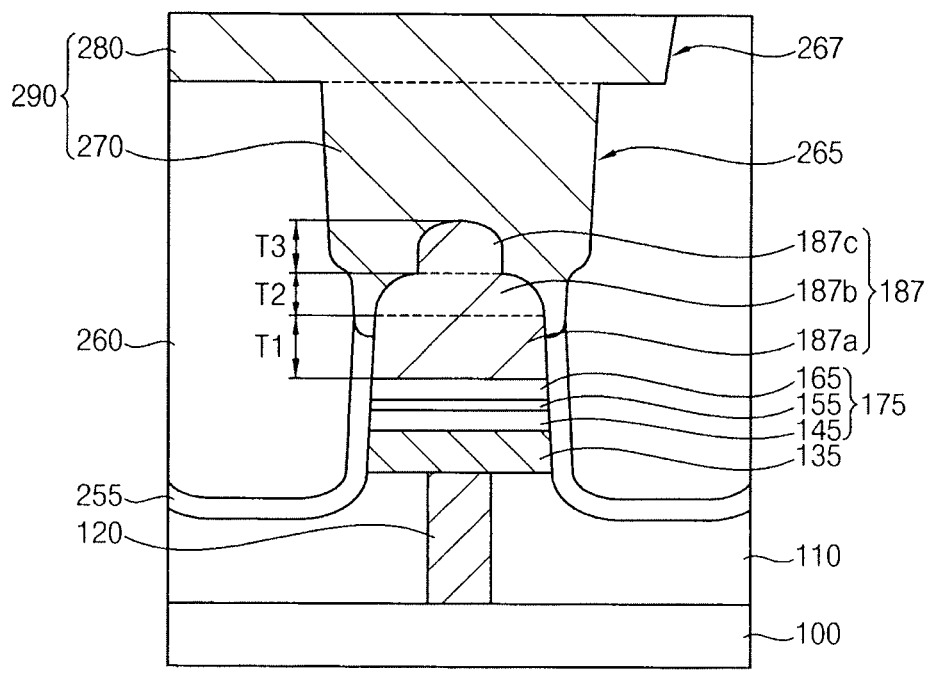

Referring to FIG. 15, the via 270 may contact the protruding portion 187c, the middle portion 187b, and a part of the lower portion 187a of the upper electrode 187. In an implementation, the via 270 may not cover all portions of the sidewall of the lower portion 187a of the upper electrode 187.

By way of summation and review, a thickness of the upper electrode may be increased to help improve the electrical characteristics of the MRAM device. Ions implanted in the diagonal direction through the subsequent IBE process could be blocked by the increased thickness of the upper electrode. For example, other upper electrodes neighboring the upper electrodes, and a lower electrode layer and an MTJ structure layer under each of the other upper electrodes may not be properly patterned.

One or more embodiments may provide an MRAM device having improved characteristics.

An MRAM device in accordance with example embodiments may include a lower electrode layer, an MTJ structure and an upper electrode sequentially stacked on a substrate, the upper electrode having a shape such that a center portion further protrudes than an edge portion in a vertical direction substantially perpendicular to an upper surface of the substrate.

For example, even if the upper electrode has a relatively large thickness, at least the center portion of the upper electrode may have a reduced width compared to the edge portion thereof, so that ions implanted through a subsequent IBE process may not be blocked by the upper electrode, and other upper electrodes neighboring the upper electrodes, and a lower electrode layer and an MTJ structure layer under each of the other upper electrodes may be effectively patterned.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a magnetoresistive random access memory (MRAM) device, the method comprising:
   sequentially forming a lower electrode layer, a magnetic tunnel junction (MTJ) structure layer, and an upper electrode layer on a substrate;
   forming a mask on the upper electrode layer;
   performing a first etching process using the mask on the upper electrode layer to form a preliminary upper electrode;
   performing a second etching process on the mask remaining on the preliminary upper electrode to reduce a width of the mask; and
   forming an upper electrode by performing a third etching process using the remaining mask having the reduced width to partially remove an upper portion of the preliminary upper electrode such that the upper electrode includes a lower portion, a middle portion, and a protruding portion sequentially stacked along a vertical direction substantially perpendicular to an upper surface of the substrate,
   wherein:
   a center portion of the protruding portion of the upper electrode protrudes from a center portion the middle portion of the upper electrode in the vertical direction,
   the protruding portion of the upper electrode has a thickness greater than a thickness of the middle portion of the upper electrode in the vertical direction, and
   the middle portion has an outwardly rounded convex shape.

2. The method as claimed in claim 1, wherein the mask includes silicon oxide.

3. The method as claimed in claim 1, wherein:
   the second etching process includes a wet etching process, and
   the third etching process includes a dry etching process.

4. The method as claimed in claim 1, further comprising forming an etch stop layer that includes silicon nitride on the upper electrode layer, prior to forming the mask on the upper electrode layer,
   wherein the first etching process includes forming an etch stop pattern by etching the etch stop layer.

5. The method as claimed in claim 4, wherein:
   the second etching process includes selectively etching the mask, and
   the etch stop pattern is not completely removed by the second etching process.

6. The method as claimed in claim 5, wherein performing the second etching process includes partially removing the etch stop pattern.

7. The method as claimed in claim 1, wherein performing the third etching process includes forming the lower portion having a sidewall with a constant slope, and the middle portion having a sidewall with a varying slope.

8. The method as claimed in claim 1, further comprising forming a lower electrode and an MTJ structure by etching the lower electrode layer and the MTJ structure layer using the upper electrode as an etching mask, after performing the third etching process.

9. The method as claimed in claim 8, further comprising, after forming the lower electrode and the MTJ structure:

forming a passivation pattern to cover a memory unit including the lower electrode, the MTJ structure, and the upper electrode;

forming a via to contact an upper surface of the upper electrode; and forming a wiring to contact the via.

10. The method as claimed in claim 9, wherein a lower surface of the via has a concave-convex shape.

11. A method of manufacturing a magnetoresistive random access memory (MRAM) device, the method comprising:

sequentially forming a lower electrode layer, a magnetic tunnel junction (MTJ) structure layer, and an upper electrode layer on a substrate;

forming a sacrificial pattern on the upper electrode layer such that the sacrificial pattern includes an opening;

forming a mask to fill the opening and then removing the sacrificial pattern;

etching the upper electrode layer using the mask to form an upper electrode;

etching the mask that remains on the upper electrode to reduce a width of the mask;

partially removing an upper portion of the upper electrode by using the mask that has the reduced width;

etching the lower electrode layer and the MTJ structure layer by using the upper electrode that the upper portion is partially removed as an etching mask to form a lower electrode and an MTJ structure such that the upper electrode includes a lower portion, a middle portion, and a protruding portion sequentially stacked along a vertical direction substantially perpendicular to an upper surface of the substrate;

forming a via to contact an upper surface of the upper electrode; and forming a wiring to contact the via, wherein:

a center portion of the protruding portion of the upper electrode protrudes from a center portion the middle portion of the upper electrode in the vertical direction, the protruding portion of the upper electrode has a thickness greater than a thickness of the middle portion of the upper electrode in the vertical direction, and the middle portion has an outwardly rounded convex shape.

12. The method as claimed in claim 11, wherein:

the sacrificial layer includes spin on hardmask (SOH), and the mask includes silicon oxide.

13. The method as claimed in claim 12, further comprising forming an etch stop layer on the upper electrode layer such that the etch stop layer includes silicon nitride, prior to forming the sacrificial pattern.

14. The method as claimed in claim 13, further comprising etching the upper electrode layer using the mask includes etching the etch stop layer to form an etch stop pattern.

15. The method as claimed in claim 11, further comprising forming a passivation layer that covers a memory unit including the lower electrode, the MTJ structure, and the upper electrode, wherein forming the via and the wiring includes removing a portion of the passivation layer that covers an upper surface of the memory unit.

* * * * *